US008402845B2

(12) United States Patent
Dedontney

(10) Patent No.: US 8,402,845 B2
(45) Date of Patent: Mar. 26, 2013

(54) DUAL PATH GAS DISTRIBUTION DEVICE

(75) Inventor: Jay B. Dedontney, Prunedale, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/596,884

(22) Filed: Aug. 28, 2012

(65) Prior Publication Data

US 2012/0324692 A1 Dec. 27, 2012

Related U.S. Application Data

(63) Continuation of application No. 13/332,104, filed on Dec. 20, 2011, now Pat. No. 8,277,888.

(51) Int. Cl.
| | |
|---|---|
| G01N 19/00 | (2006.01) |
| G01F 1/00 | (2006.01) |
| C23F 1/00 | (2006.01) |
| H01L 21/306 | (2006.01) |
| C23C 16/455 | (2006.01) |
| C23C 16/44 | (2006.01) |
| B67D 7/30 | (2010.01) |
| C23C 16/06 | (2006.01) |
| C23C 16/22 | (2006.01) |

(52) U.S. Cl. ......... 73/865.9; 118/728; 118/50; 118/715; 156/345.29; 156/345.33; 156/345.34; 156/345.26; 427/248.1; 73/861; 222/14; 222/59; 222/71

(58) Field of Classification Search ............... 427/248.1; 118/715, 728, 50; 156/345.29, 345.33, 345.34, 156/345.26; 73/865.9, 861; 222/14, 59, 222/71

See application file for complete search history.

(56) References Cited

U.S. PATENT DOCUMENTS

| | | | | |
|---|---|---|---|---|
| 4,468,283 | A * | 8/1984 | Ahmed | 117/102 |
| 4,590,042 | A * | 5/1986 | Drage | 422/186.06 |
| 5,422,139 | A * | 6/1995 | Fischer | 427/248.1 |
| 5,480,678 | A * | 1/1996 | Rudolph et al. | 427/248.1 |
| 5,950,925 | A * | 9/1999 | Fukunaga et al. | 239/132.3 |
| 6,161,500 | A * | 12/2000 | Kopacz et al. | 118/723 E |
| 6,245,192 | B1 * | 6/2001 | Dhindsa et al. | 156/345.34 |
| 6,315,832 | B1 * | 11/2001 | Liu | 118/602 |
| 6,368,987 | B1 * | 4/2002 | Kopacz et al. | 438/788 |
| 6,432,831 | B2 * | 8/2002 | Dhindsa et al. | 438/710 |
| 7,252,716 | B2 * | 8/2007 | Kim et al. | 118/715 |
| 7,481,886 | B2 * | 1/2009 | Kato et al. | 118/715 |
| 7,572,686 | B2 * | 8/2009 | Levy et al. | 438/149 |
| 7,581,511 | B2 * | 9/2009 | Mardian et al. | 118/723 MW |
| 7,789,961 | B2 * | 9/2010 | Nelson et al. | 118/715 |
| 7,850,780 | B2 * | 12/2010 | Levy et al. | 118/715 |
| 7,886,687 | B2 * | 2/2011 | Lee et al. | 118/723 E |
| 7,972,441 | B2 * | 7/2011 | Yokota et al. | 118/715 |
| 7,976,631 | B2 * | 7/2011 | Burrows et al. | 118/715 |
| 8,277,888 | B2 * | 10/2012 | Dedontney | 427/248.1 |
| 8,293,013 | B2 * | 10/2012 | DeDontney | 118/715 |
| 2001/0027026 | A1 * | 10/2001 | Dhindsa et al. | 438/712 |
| 2004/0134611 | A1 * | 7/2004 | Kato et al. | 156/345.33 |
| 2005/0016455 | A1 * | 1/2005 | Cho et al. | 118/723 E |
| 2006/0011298 | A1 * | 1/2006 | Lim et al. | 156/345.34 |

(Continued)

*Primary Examiner* — Rudy Zervigon

(57) ABSTRACT

An apparatus for deploying two fluids separately into a reaction chamber is provided. The apparatus includes a first distribution network that is formed on a plate having a distribution face and a dispensing face. The first distribution network is defined by a plurality of recessed channels on the distribution face. The plurality of recessed channels includes a plurality of thru-ports that extend from the plurality of recessed channels to the dispensing face. The apparatus further includes a second distribution network that has passages formed below the plurality of recessed channels and above the dispensing face. A first set of ports extends from the passages to the distribution face and a second set of ports extends from a top surface of the distribution face to the dispensing face.

6 Claims, 14 Drawing Sheets

U.S. PATENT DOCUMENTS

| | | | |
|---|---|---|---|
| 2006/0021574 A1* | 2/2006 | Armour et al. | 118/715 |
| 2008/0081114 A1* | 4/2008 | Johanson et al. | 427/273 |
| 2008/0166880 A1* | 7/2008 | Levy | 438/758 |
| 2008/0166884 A1* | 7/2008 | Nelson et al. | 438/765 |
| 2009/0078204 A1* | 3/2009 | Kerr et al. | 118/728 |
| 2009/0081366 A1* | 3/2009 | Kerr et al. | 427/255.28 |
| 2009/0081886 A1* | 3/2009 | Levy et al. | 438/790 |
| 2009/0095221 A1* | 4/2009 | Tam et al. | 118/715 |
| 2009/0098276 A1* | 4/2009 | Burrows et al. | 427/8 |
| 2009/0130858 A1* | 5/2009 | Levy | 438/765 |
| 2009/0162260 A1* | 6/2009 | Bera et al. | 422/186.04 |
| 2009/0162261 A1* | 6/2009 | Baera et al. | 422/186.04 |
| 2009/0162262 A1* | 6/2009 | Bera et al. | 422/186.04 |
| 2010/0167551 A1* | 7/2010 | DeDontney | 438/758 |
| 2010/0261340 A1* | 10/2010 | Nijhawan et al. | 438/478 |
| 2011/0052833 A1* | 3/2011 | Hanawa et al. | 427/534 |

* cited by examiner

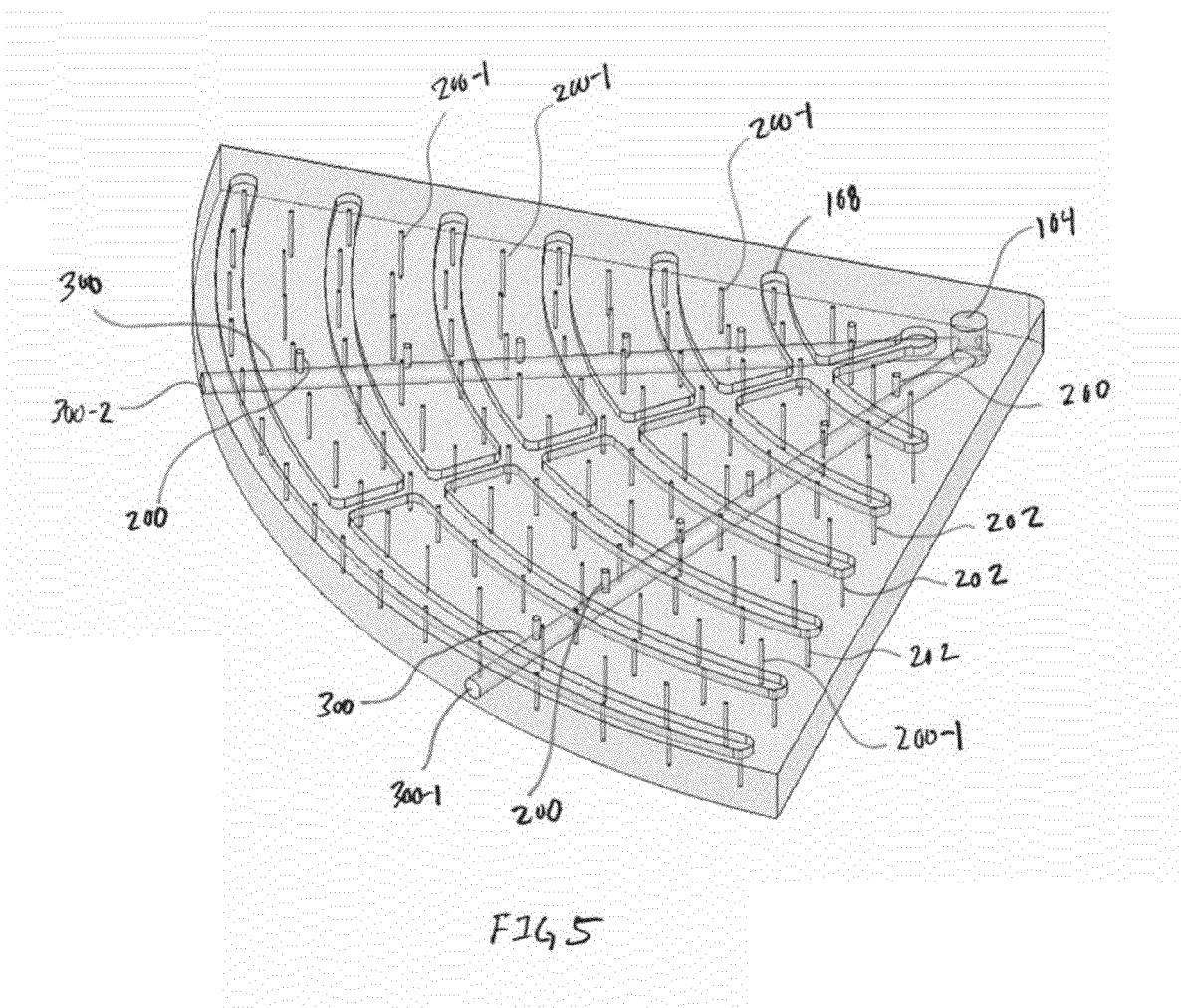

DUAL PATH GAS DISTRIBUTION DEVICE

PRIORITY CLAIM TO RELATED APPLICATIONS

This application is a Continuation Application of U.S. patent application Ser. No. 13/332,104 entitled "Dual Path Gas Distribution Device" filed on Dec. 20, 2011 which is a Divisional Application of U.S. patent application Ser. No. 12/346,195 entitled "Dual Path Gas Distribution Device" filed on Dec. 30, 2008, both of which are incorporated herein by reference for all purposes.

BACKGROUND

Combinatorial processing enables rapid evaluation of semiconductor processing operations. The systems supporting the combinatorial processing are flexible to accommodate the demands for running the different processes either in parallel, serial or some combination of the two.

Some exemplary semiconductor processing operations includes operations for adding (depositions) and removing layers (etch), defining features, preparing layers (e.g., cleans), doping, etc. Similar processing techniques apply to the manufacture of integrated circuit (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct research and development (R&D) on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate. Equipment for performing the combinatorial processing must support the efficiency offered through the combinatorial processing operations.

It is within this context that the invention arises.

BRIEF DESCRIPTION OF THE DRAWINGS

The invention, together with further advantages thereof, may best be understood by reference to the following description taken in conjunction with the accompanying drawings.

FIG. 5 is a perspective view of a translucent plate of a portion of a showerhead illustrating the various internal pathways, in accordance with one embodiment of the present invention.

DETAILED DESCRIPTION

Figure 1A:
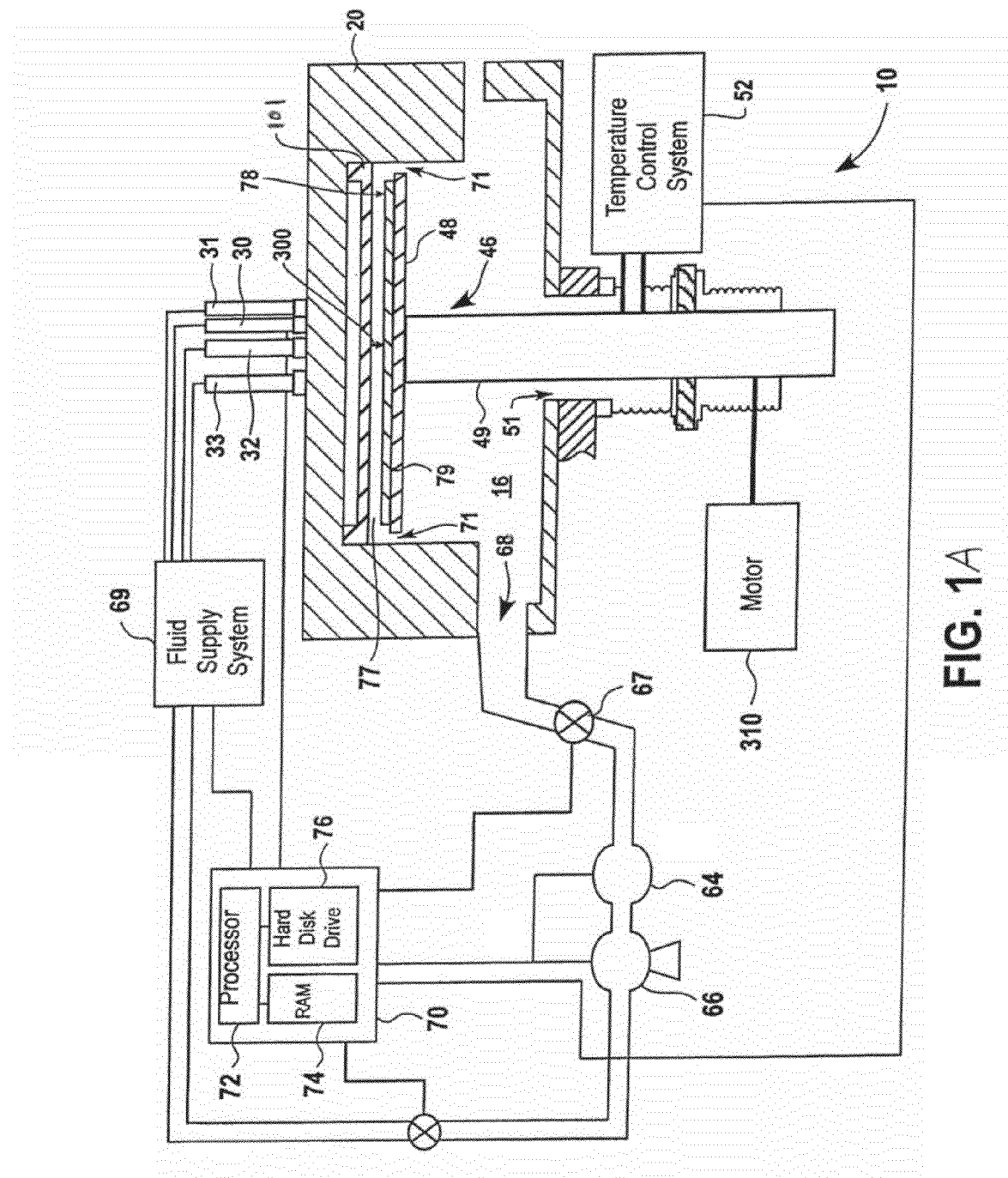
FIG. 1A is a representation of an exemplary substrate processing system in accordance with one embodiment of the present invention.

The embodiments described herein provide for a High Productivity Combinatorial (HPC) method and apparatus enabling combinatorial processing for Atomic Layer Deposition (ALD) operations. In one embodiment, a showerhead providing separate pathways into a reaction zone prevents any pre-reaction of the chemistries within the showerhead or upstream of the depositions region. In another embodiment, a showerhead having multiple segments where each segment has different geometric properties for distributing multiple fluids used in an ALD process. The ALD process is performed on a substrate in a combinatorial fashion so various regions of the substrate are processed differently. These regions are then tested to determine the effectiveness of the ALD process. It will be apparent, however, to one skilled in the art, that the present invention may be practiced without some or all of these specific details. In other instances, well known process operations have not been described in detail in order not to unnecessarily obscure the present invention.

The embodiments described below further provide details for a multi-region processing system and associated showerhead that enable processing a substrate in a combinatorial fashion. Thus, different regions of the substrate may have different properties, which may be due to variations of the materials, unit processes (e.g., processing conditions or parameters) and process sequences, etc. For some embodiments, within each region the conditions are preferably substantially uniform so as to mimic conventional full wafer processing within each region. However, useful results can be obtained for certain experiments without this requirement. In one embodiment, the different regions are isolated so that there is no inter-diffusion between the different regions.

In addition, the combinatorial processing of the substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial processing and return the substrate to the manufacturing process flow for further processing. Alternatively, the substrate can be processed in an integrated tool that allows both combinatorial and conventional processing in various chambers attached around a central chamber or within a R&D facility such as a clean room. Consequently, in one substrate, information concerning the varied processes and the interaction of the varied processes with conventional processes can be evaluated. Accordingly, a multitude of data is available from a single substrate for a desired process.

The embodiments described herein enable the application of combinatorial techniques for process sequence integration of semiconductor manufacturing operations. Combinatorial processing applied to semiconductor manufacturing operations assists in arriving at a globally optimal sequence of semiconductor manufacturing operations by considering interaction effects between the unit manufacturing operations, the process sequence of the unit manufacturing operations, the process conditions used to effect such unit manufacturing operations, as well as materials characteristics of components utilized within the unit manufacturing operations. The embodiments described below provide details for a multi-region processing system and associated reaction chambers that enable processing a substrate in a combinatorial fashion. In one embodiment, the different regions are isolated (e.g., 'site-isolated') so that there is no interdiffusion between the different regions.

The embodiments are capable of analyzing a portion or subset of the overall process sequence used to manufacture semiconductor devices. Once the subset of the process sequence is identified for analysis, combinatorial process sequence integration testing is performed to optimize the materials, unit processes, and process sequences used to build that portion of the device or structure. According to some embodiments described herein, the processing may take place over structures formed on the semiconductor substrate, which are equivalent to the structures formed during actual production of the semiconductor device. For example, structures may include, but not be limited to, trenches, vias, interconnect lines, capping layers, masking layers, diodes, memory elements, gate stacks, transistors, or any other series of layers or unit processes that create a structure found on semiconductor chips.

In some embodiments, while the combinatorial processing varies certain materials, unit processes, or process sequences, the composition or thickness of the layers or structures, or the action of the unit process is substantially uniform for each region. It should be noted that the process can be varied between regions, for example, a thickness of a layer is varied or one of various process parameters or conditions, such as a voltage, flow rate, etc., may be varied between regions, as desired by the design of the experiment. The result is a series of regions on the substrate that contains structures or unit process sequences that have been uniformly applied within that region and, as applicable, across different regions. This process uniformity allows comparison of the properties within and across the different regions such that variations and test results are due to the parameter being modified, e.g., materials, unit processes, unit process parameters, or process sequences, and not the lack of process uniformity. In essence, the combinatorial processing performs semiconductor manufacturing operations on multiple regions of a substrate so that the multiple regions are processed differently to achieve different results. An application of the showerhead described herein with regard to combinatorial processing is further described with reference to FIGS. 9-11.

FIG. 1A is a representation of an exemplary substrate processing system 10 in accordance with one embodiment of the present invention. The substrate processing system 10 includes an enclosure that is formed from a process-compatible material that for simplicity and clarity is not shown. A processing chamber 16 and a vacuum lid assembly 20 cover an opening to processing chamber 16 and are located within the enclosure. Mounted to vacuum lid assembly 20 is a process fluid injection assembly that delivers reactive and carrier fluids into processing chamber 16. To that end, the fluid injection assembly includes a plurality of passageways 30, 31, 32 and 33 and a showerhead portion 101. The vacuum lid assembly 20, and showerhead 90 may be maintained within desired temperature ranges in a conventional manner. It should be appreciated that the Figures provided herein are illustrative and not necessarily drawn to scale.

A heater/lift assembly 46 is disposed within processing chamber 16. Heater/lift assembly 46 includes a support pedestal 48 connected to a support shaft 49. Support pedestal 48 is positioned between shaft 49 and vacuum lid assembly 20. Support pedestal 48 may be formed from any process-compatible material, including aluminum nitride and aluminum oxide ($Al_2O_3$ or alumina) and is configured to hold a substrate thereon, e.g., support pedestal 48 may be a vacuum chuck or utilize other conventional techniques such as an electrostatic chuck (ESC) or physical clamping mechanisms. Heater lift assembly 46 is adapted to be controllably moved so as to vary the distance between support pedestal 48 and the showerhead 90 to control the substrate to showerhead spacing. A sensor (not shown) provides information concerning the position of support pedestal 48 within processing chamber 16. Support pedestal 48 can be used to heat the substrate through the use of heating elements (not shown) such as resistive heating elements embedded in the pedestal assembly.

A fluid supply system 69 is in fluid communication with passageways 30, 31, 32 and 33 through a sequence of conduits. Flows of processing fluids, from fluid supply system 69, within processing chamber 16 are provided, in part, by a pressure control system that may include one or more pumps, such as turbo pump 64 and roughing pump 66 both of which are in fluid communication with processing chamber 16 via a butterfly valve 67 and pump channel 68. Controller 70 regulates the operations of the various components of system 10. Controller 70 includes a processor 72 in data communication with memory, such as random access memory 74 and a hard disk drive 76 and is in signal communication with pump system 64, temperature control system 52, fluid supply system 69 and various other aspects of the system as required. System 10 may establish conditions in a region 77 of processing chamber 16 located proximate to a surface 78 of a substrate 79 disposed on support pedestal 48 to form desired material thereon, such as a thin film. It should be appreciated that processing chamber 16 is configured to create a peripheral flow channel 71 that surrounds support pedestal 48 when placed in a processing position to provide processing region 77 with the desired dimensions based upon chemical processes to be achieved by system 10. Pump channel 68 is situated in housing 14 so that processing region 77 is positioned between pump channel 68 and showerhead portion 101.

The dimensions of peripheral flow channel 71 are defined to provide a desired conductance of processing fluids therethrough that provide flows of processing fluids over a surface 78 of substrate 79 in a substantially uniform manner and in an axi-symmetric fashion. In one embodiment, the conductance through pump channel 68 is chosen to be larger than the conductance through peripheral flow channel 71. It should be noted that the processing chamber of FIG. 1A is one exemplary processing chamber and the embodiments described herein may be incorporated into other processing chambers as desired.

Figure 1B:
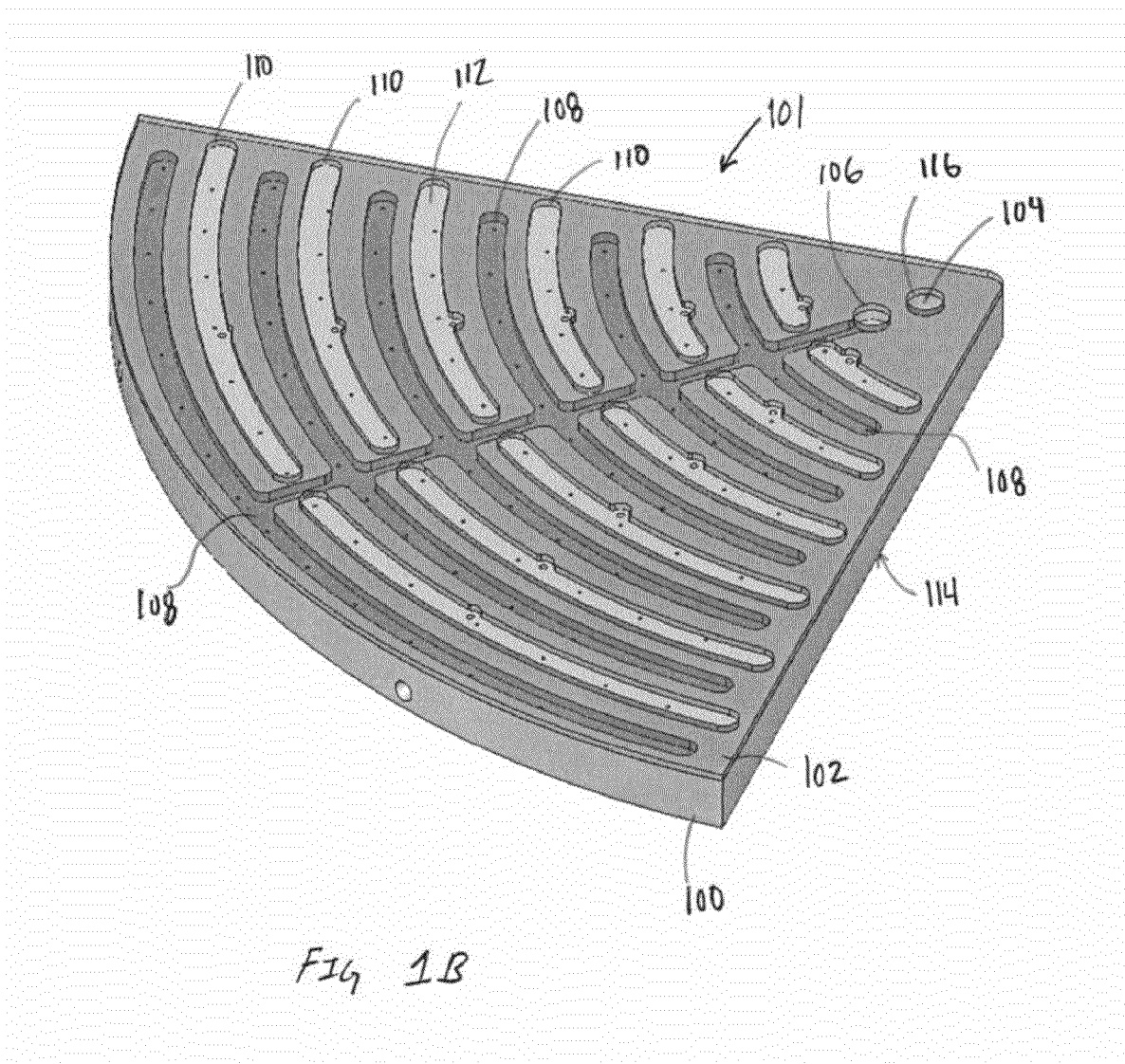
FIG. 1B is an exemplary view of a portion of a showerhead, in accordance with one embodiment of the present invention.

FIG. 1B is an exemplary view of a showerhead portion 101, in accordance with one embodiment of the present invention. The illustration should not be perceived as inclusive as the showerhead portion 101 may include additional components. For simplicity and clarity, the gas distribution elements of the showerhead portion 101 include a plate 100 and a gasket 102. In the embodiment shown in FIG. 1B the gasket 102 is rendered as translucent so features on the plate 100 are visible. The plate 100 has a distribution face 112 and on an opposing side from the distribution face 112 is a dispensing face 114. Formed on the distribution face 112 is a plurality of channels 108 and an internal inlet 104. Channels 108 are defined periodically at different radial lengths from a center of the showerhead along a depth of the surface of showerhead portion 101. A channel extending radially from a center region of showerhead portion 101 interconnects channels 108.

FIG. 1B shows a quarter of the showerhead portion 101 in this exemplary embodiment. In other embodiments the showerhead portion 101 can be made to be any portion of the showerhead, such as, but not limited to a half, a third, an eighth, etc. Similarly, the circular shape of the portion of the showerhead portion 101 should also not be considered limiting as the showerhead portion 101 can be made to any shape. The multiple portions of the showerhead may be supported through a nesting into which the portions are placed. One skilled in the art will appreciate that known support techniques for the multiple portions may be utilized to support the showerhead portions on a top surface of the chamber.

When assembled, the gasket 102 is pressed onto the distribution face 112 and isolates the channels 108 from the gasket network 110. The gasket 102 includes a gasket opening 106 that is aligned with the channel 108 and a gasket opening 116 that is aligned with the internal inlet 104. The gasket 102 further includes a gasket network 110. The gasket network 110 includes a plurality of cutouts through the gasket 102 that are aligned with features on the plate 100 that will be described in further detail below. In addition, the cutout shapes for gasket 102 are exemplary. That is, any suitable shape that isolates gasket network 110 from channels 108 is acceptable.

In one exemplary embodiment, the plate 100 is formed from a material such as aluminum with a thickness of about 8 millimeters. In other embodiments, the plate 100 is formed from materials such as, but not limited to steels and ceramics with thicknesses within a range of about 4 millimeters to about 12 millimeters. In still other embodiment, the plate 100 is formed from materials that are non-reactive with processing fluids used within the processing system with a thickness that is determined based on the particular process fluids and the required flow rates of the process fluids.

Figure 2:
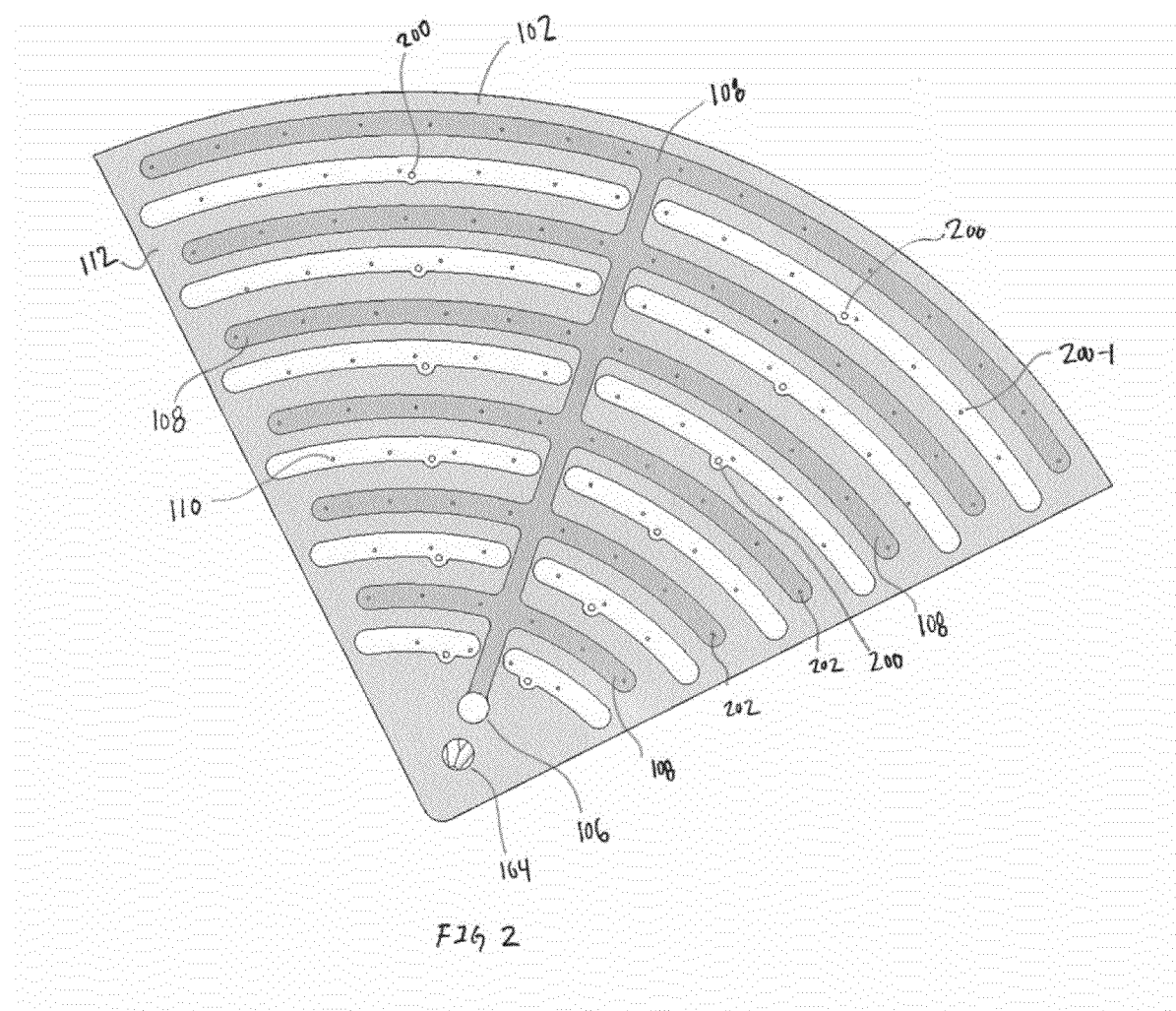
FIGS. 2 and 2B are an exemplary view of portion of the gasket and the distribution face of the showerhead, in accordance with one embodiment of the present invention.
Figure 2B:
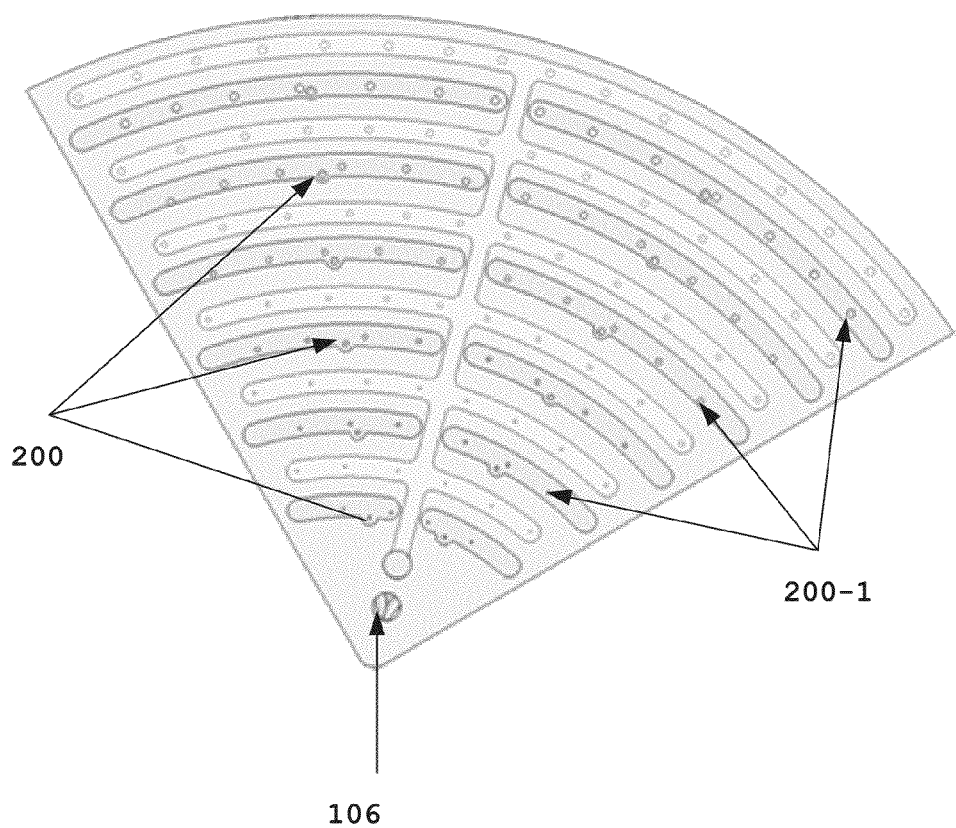

FIG. 2 is an exemplary view of a portion of the gasket 102 and the distribution face 112 of the showerhead portion 101, in accordance with one embodiment of the present invention. The gasket 102 has been rendered as translucent so features on the plate 100 are visible. In this view, additional features on the distribution face 112 are visible. For example, channel thru-ports 202 are illustrated within the channel 108. The channel thru-ports 202 extend from the distribution face 112 to the dispensing face on the opposing side of showerhead 101. In one embodiment, the channel thru-ports are about 0.4 millimeters in diameter. In other embodiments, the size of the thru-ports can range between about 0.25 millimeters and about 2 millimeters. The gasket opening 106 allows a first fluid to be introduced within the channel 108. With the gasket 102 in place, the first fluid is constrained to flow within the channel 108. The channel thru-ports 202 allow the first fluid to flow from the channel 108 on the distribution face 112 to the dispensing face (not shown).

Another feature on the distribution face 112 is an internal network port 200 that is associated with a plurality of internal network thru-ports 200-1. The internal network thru-ports 200-1 extends from the distribution face 112 to the dispensing face. In one embodiment, the internal network ports 200 are connected to the internal inlet 104 by an internal network (not shown) formed between the distribution face 112 and the dispensing face. The combination of the internal network ports 200 and the internal network thru-ports 200-1 allows a second fluid that is supplied through the internal inlet 104 to be distributed across the distribution face. Fluid introduced through the internal inlet 104 is routed to the internal network ports 200 via the internal network as described in more detail below. With the gasket 102 in place, fluid flowing from the internal network ports 200 is confined within the gasket network 110, and flows to the dispensing face via the internal network thru-ports 200-1.

Figure 3:
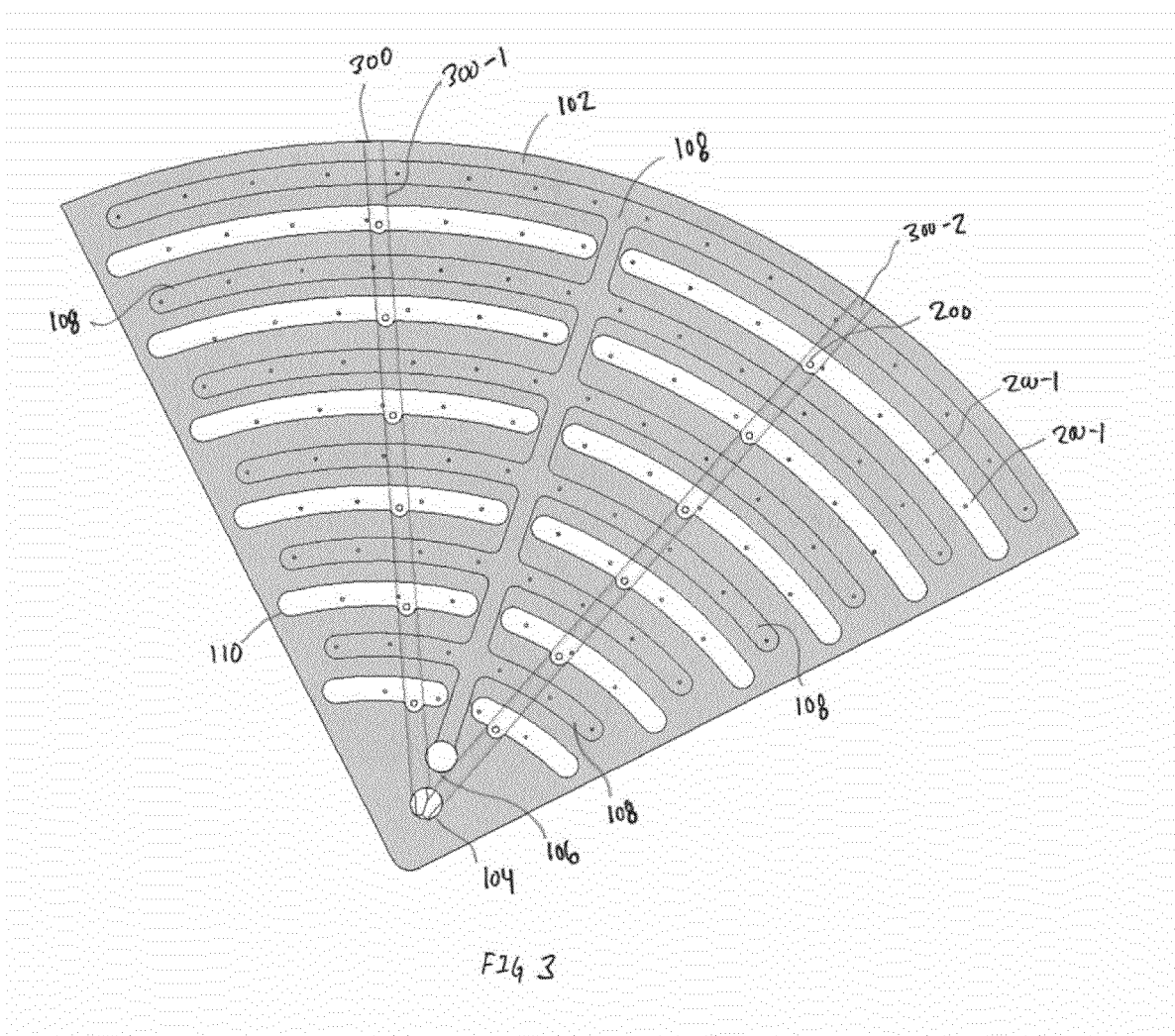
FIG. 3 is an exemplary illustration of a portion of a showerhead where both the plate and the gasket are translucent in order to illustrate the internal network, in accordance with one embodiment of the present invention.

FIG. 3 is an exemplary illustration where both the plate 100 and the gasket 102 have been rendered as translucent in order to illustrate the internal network 300, in accordance with one embodiment of the present invention. The illustrated embodiment of the internal network 300 includes two passages 300-1 and 300-2 extending radially from the internal inlet 104. In one embodiment, the passages 300-1 and 300-2 are about 6 millimeters in diameter. In other embodiments, the diameter of passages 300-1 and 300-2 are within a range of about 3 millimeters to about 8 millimeters. The configuration illustrated in FIG. 3 should not be construed as limiting as other embodiments can have fewer or additional passages. Furthermore, other embodiments can have the internal inlet 104 placed at a different location or even include multiple internal inlets 104 connected to multiple passages. As illustrated, one gas or fluid is distributed into internal inlet 104 from a fluid supply source into passages 300-1 and 300-2 and through internal network ports 200. As the gasket is sealed against a top surface of the chamber, the fluid emanating from internal network ports 200 flows into internal network thru-ports 200-1 into the reaction chamber or deposition region. In one embodiment, the internal network ports 200 are about 2 millimeters in diameter. In other embodiments, the internal network ports 200 are formed with a diameter within a range of about 1 millimeter to about 4 millimeters. Similarly, in one embodiment, the internal network thru-ports 200-1 are about 0.4 millimeters in diameter. In other embodiments, the internal network thru-ports 200-1 are formed with a diameter within a range of about 0.25 millimeter to about 2 millimeters.

A second gas or fluid is distributed into opening 106 and into channels 108. From channels 108, the fluid flows into channel thru ports 202 into the reaction chamber or deposition region. Accordingly, the fluid flows are isolated from each other to maintain purity of each fluid stream prior to reaching the deposition region. With regard to highly reactive components, such as the precursors for metal oxides used with chalcogenide, the showerhead configuration described herein enables the combinatorial deposition of components that cannot mix inline prior to the deposition chamber.

Figure 4:
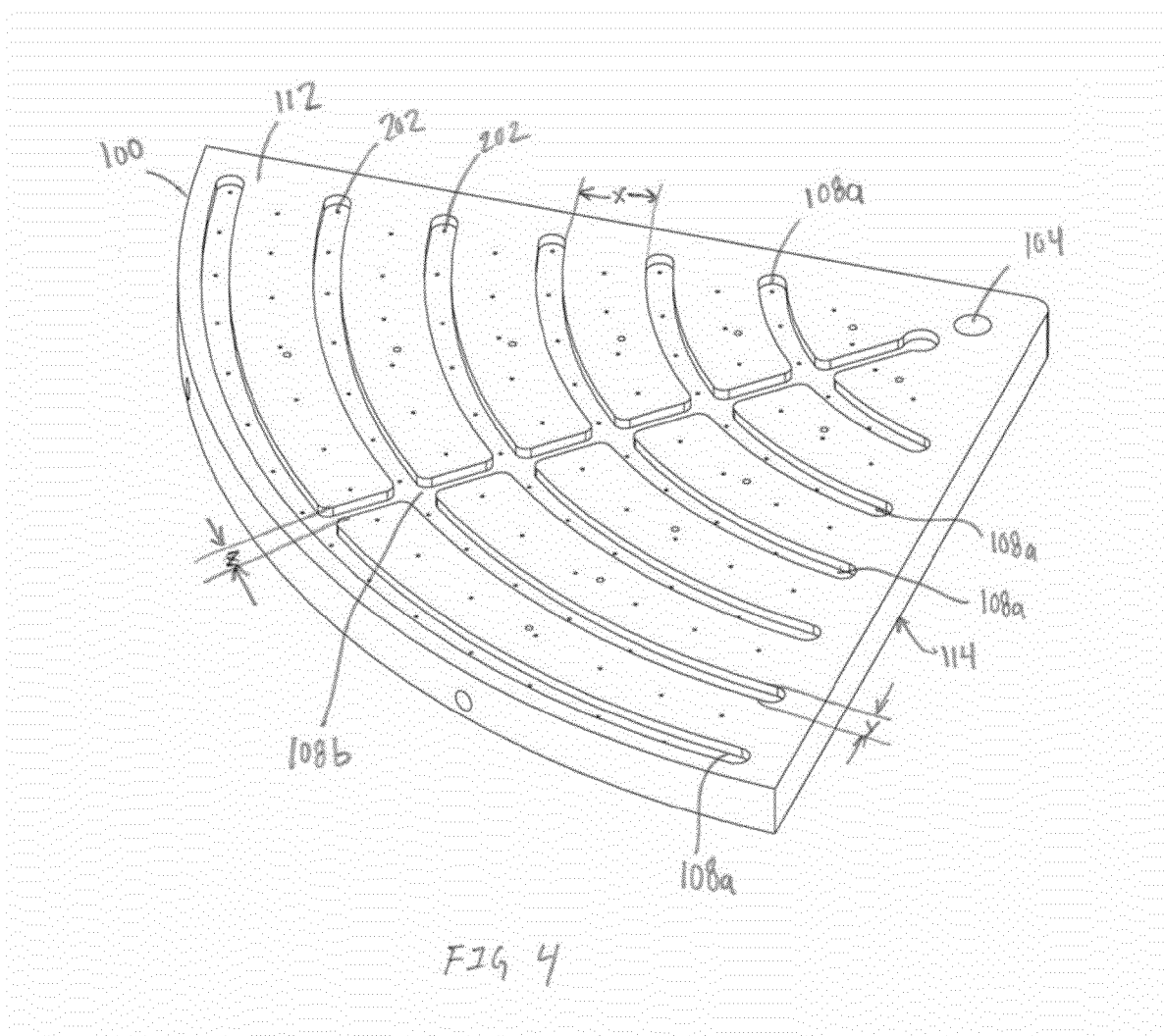
FIGS. 4 and 4B are a perspective view of the plate of a portion of a showerhead, in accordance with one embodiment of the present invention.
Figure 4B:
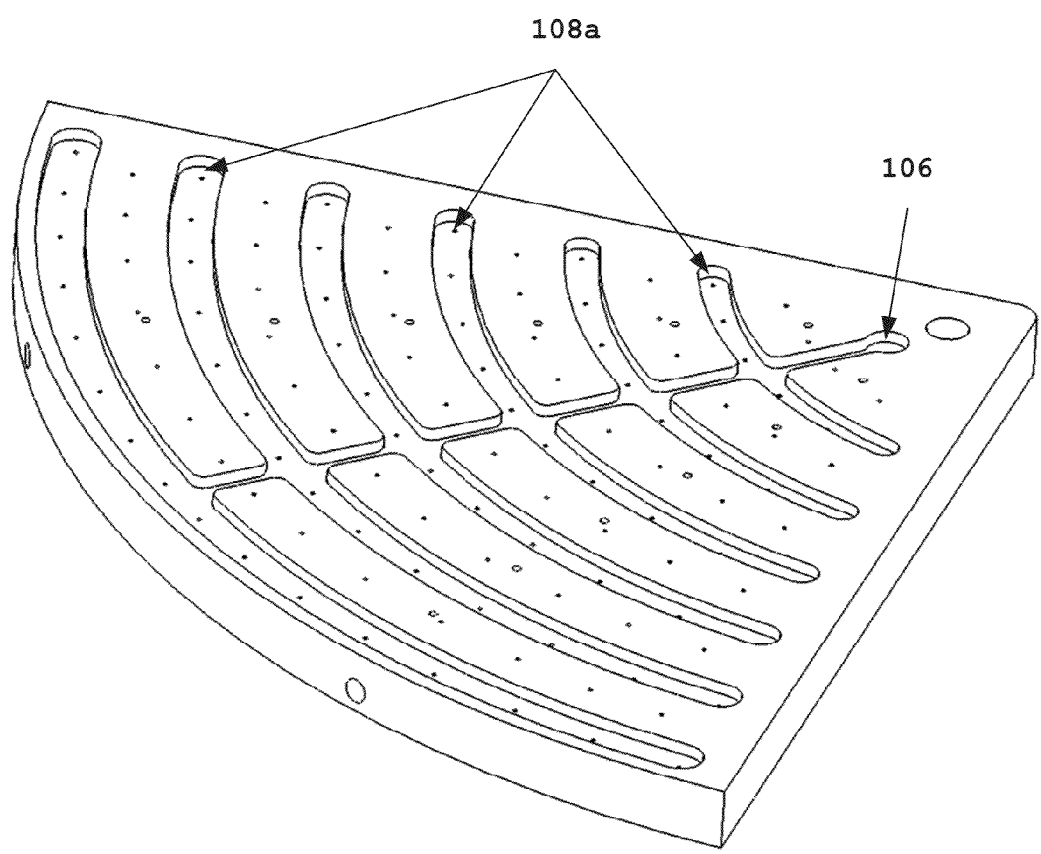

FIG. 4 is a perspective view of the plate 100, in accordance with one embodiment of the present invention. A plurality of channels are formed on the distribution face 112 of the plate 100 and distributes a first fluid through network where the width of radial channels 108a is defined by dimension Y. Additionally, spacing between radial channels is defined by dimension X and the radial channels are interconnected with a distribution channel 108b defined by dimension Z. In the embodiment shown, the radial channels 108a are equally spaced apart and have a same width. Likewise, the distribution channel 108b is a uniform width. However, in other embodiments, the spacing between radial channels 108a may vary, along with the width of the radial channels and the width of the distribution channel 108b. Furthermore, in other embodiments, additional distribution channels 108b can be included to provide additional fluid distribution to radial channels 108a.

While FIG. 4 shows the channel thru-ports 202 being uniform in size, the channel thru-ports 202 can vary in size just as the dimensions of the radial channels 108a can be varied. For example, the size of the channel thru-ports 202 can be uniform within a radial channel 108a. Alternatively, the size of the channel thru-ports 202 can increase as the distance from the distribution channel 108 from internal inlet 104 increases. Similarly, the size of the channel thru-ports 202 can increase in proportion to the distance of a radial channel 108a from the center of the plate 100. The ability to modify the physical characteristics of the radial channels 108a and the distribution channel 108b along with the thru-ports 202 is advantageous because it can promote or restrict fluid flow to specific areas of the showerhead and thus the effects of varying the fluid flow can be evaluated in a combinatorial manner.

FIG. 5 is an exemplary perspective view with the plate 100 being rendered as translucent, to illustrate the various internal pathways, in accordance with one embodiment of the present invention. The channel thru-ports 202 are visible extending from a surface of the channel 108 to a surface of the dispensing face 114. Similarly, the internal network 300 is visible with passages 300-1 and 300-2 originating from internal inlet 104. Evenly spaced along the passages 300-1 and 300-2 are internal network ports 200. The internal network ports 200 allow fluid to move from the passages 300-1 and 300-2 to the distribution face 112. Associated with each internal network port 200 are internal network thru-ports 200-1. In one embodiment, the internal network port 200 and associated internal network thru-ports 200-1 are arranged in radial groups. When the gasket is present, fluid supplied to the distribution face 112 from the internal network ports 200 will be constrained within the radial groups by the gasket network and flow from the distribution face 112 to the dispensing face 114 via the internal network thru-ports 200-1. Thus the path of the fluid from the passages 330-1 and 300-2 proceed to a top surface of the showerhead and then over the top surface into internal network thru-ports to the dispensing face of the showerhead for introduction into the deposition chamber.

Figure 6:
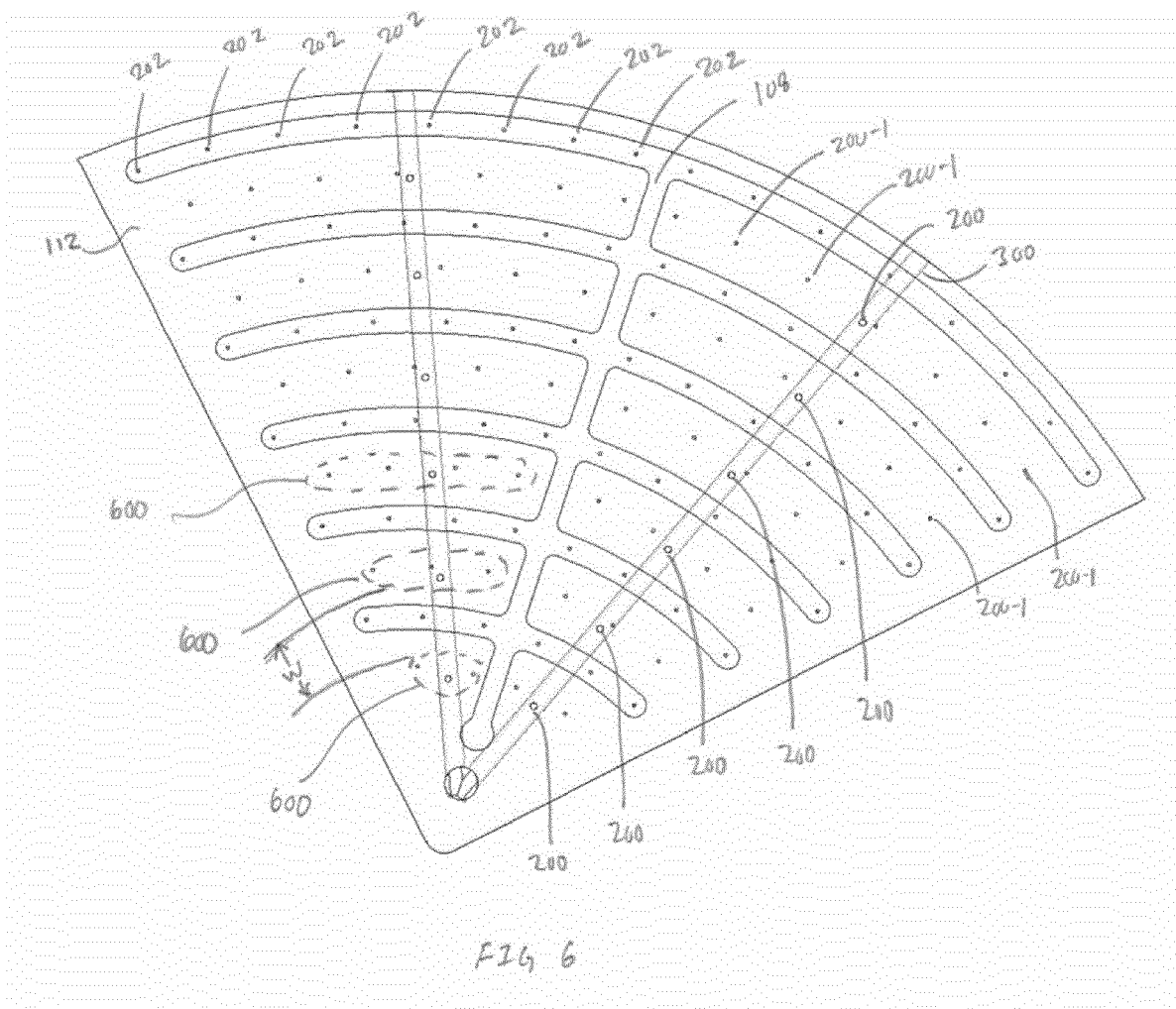
FIG. 6 is a view of the distribution face and the internal network within a portion of a showerhead, in accordance with one embodiment of the present invention.

FIG. 6 is a view of the distribution face 112 and the radial groups 600 of the internal network 300, in accordance with one embodiment of the present invention. The radial groups 600 are separated by a distance W. While FIG. 6 shows the radial groups 600 being evenly spaced apart, other embodiments can have varying spacing between the radial groups and/or the ports within the radial groups. For example, in one embodiment, as the radial groups get farther from the center, the distance between the radial groups gets smaller. To promote even distribution of fluids from both the internal network thru-ports 200-1 and the channel thru-ports 202, the relative spacing of the respective radial channels 108a and radial groups 600 may be altered. As illustrated in FIG. 6, an alternating pattern of radial groups 600 and radial channels 108a is provided for relative symmetry in fluid distribution. However, in other embodiments, it may be advantageous to have asymmetrical fluid distribution facilitated by a greater number of radial channels 108a than radial groups 600, or vice versa. Thus, varying configurations are capable within the embodiments described herein.

It should be appreciated that changing the size of the internal network ports 200 or the internal network thru-ports 200-1 can modify fluid distribution from the radial groups 600. For example, the size of the internal network ports 200 can be proportional to the distance of the internal network port 200 from the internal inlet 104. Similarly, the size of the internal network thru-ports 200-1 can increase proportional to the distance of the radial group 600 from the internal inlet 104. In other embodiments, the size of the internal network thru-ports 200-1 can be different within the respective radial group 600. For example, the size of the internal network thru-ports 200-1 can increase in proportion to the distance from the internal network port 200. Accordingly, one skilled in the art will appreciate that numerous dimensions and configurations of the illustrated embodiments may be utilized to enhance the combinatorial evaluation.

Figure 7:
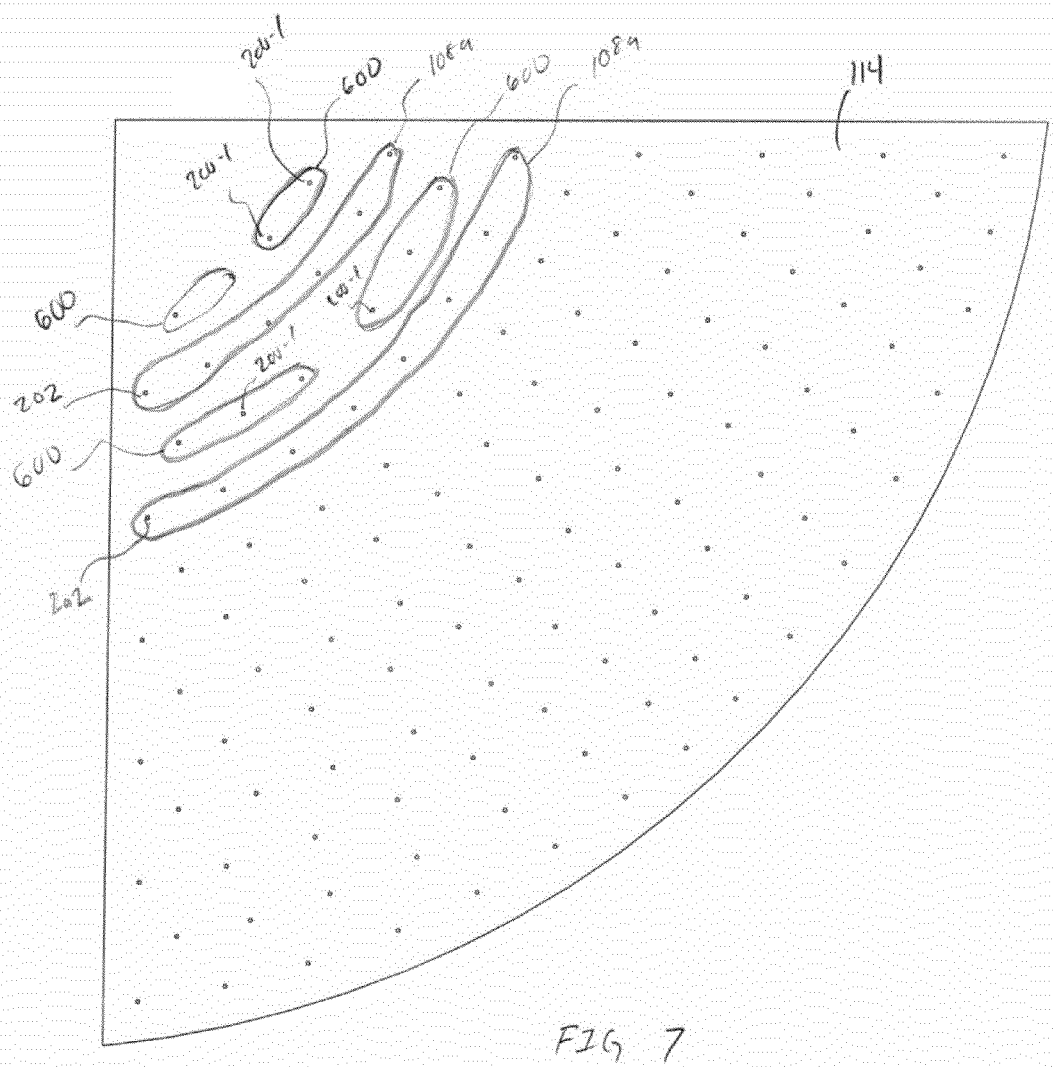
FIG. 7 is a view of the dispensing face of a portion of a showerhead, in accordance with one embodiment of the present invention.

FIG. 7 is a view of the dispending face 114, in accordance with one embodiment of the present invention. Highlighted on the dispensing face 114 are exemplary radial groups 600 and radial channel 108a. Within the radial groups 600, internal network thru-ports 200-1 are visible. Similarly, within the radial channels 108a, channel thru-ports 202 are visible. As previously discussed, various embodiments allow for different spacing between the radial groups 600 and the radial channels 108a. Similarly, different embodiments allow for varying size of channel thru-ports 202 and internal network thru-ports 200-1. Furthermore, other embodiments vary the size of the segment of the showerhead. In yet other embodiments, thru ports 200-1 and 202 may be distributed differently for evaluation of the distribution on the resulting deposited layer.

Figure 8:
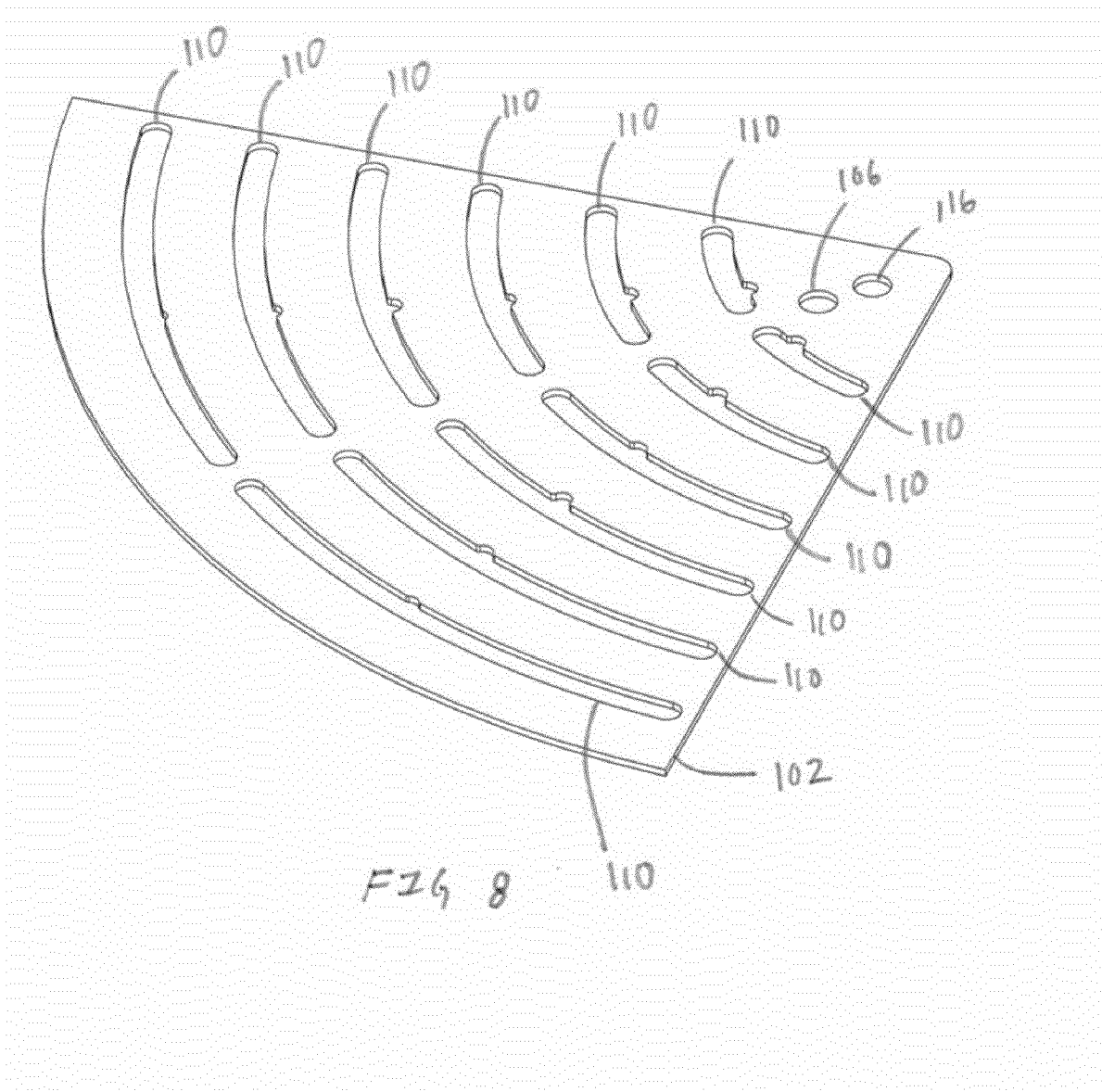
FIG. 8 is a perspective view of the gasket for use with a portion of a showerhead, in accordance with one embodiment of the present invention.

FIG. 8 is a perspective view of the gasket 102, in accordance with one embodiment of the present invention. The gasket 102 has a plate seal surface 800 that is placed in contact with the distribution face of the plate. When installed in contact with the plate, gasket opening 116 is aligned with the internal inlet while the gasket opening 106 is aligned with the channel 108. The gasket network 110 is configured to align with the radial groups 600 and contain fluid flow from the internal network ports to the internal network thru-ports. In one embodiment, the gasket 102 is formed from a non-reactive material that is more compliant that the mating surface of the plate. Exemplary materials for the gasket include, but are not limited to, polytetrafluoroethylene (PTFE) or polyamide based polymers such as Vespel. In an exemplary embodiment, the gasket 102 is formed from Vespel with a thickness of about 3 millimeters. In other embodiments, the gasket 102 is formed from a material within a thickness range of about 1.5 millimeters to about 5 millimeters.

Figure 9:
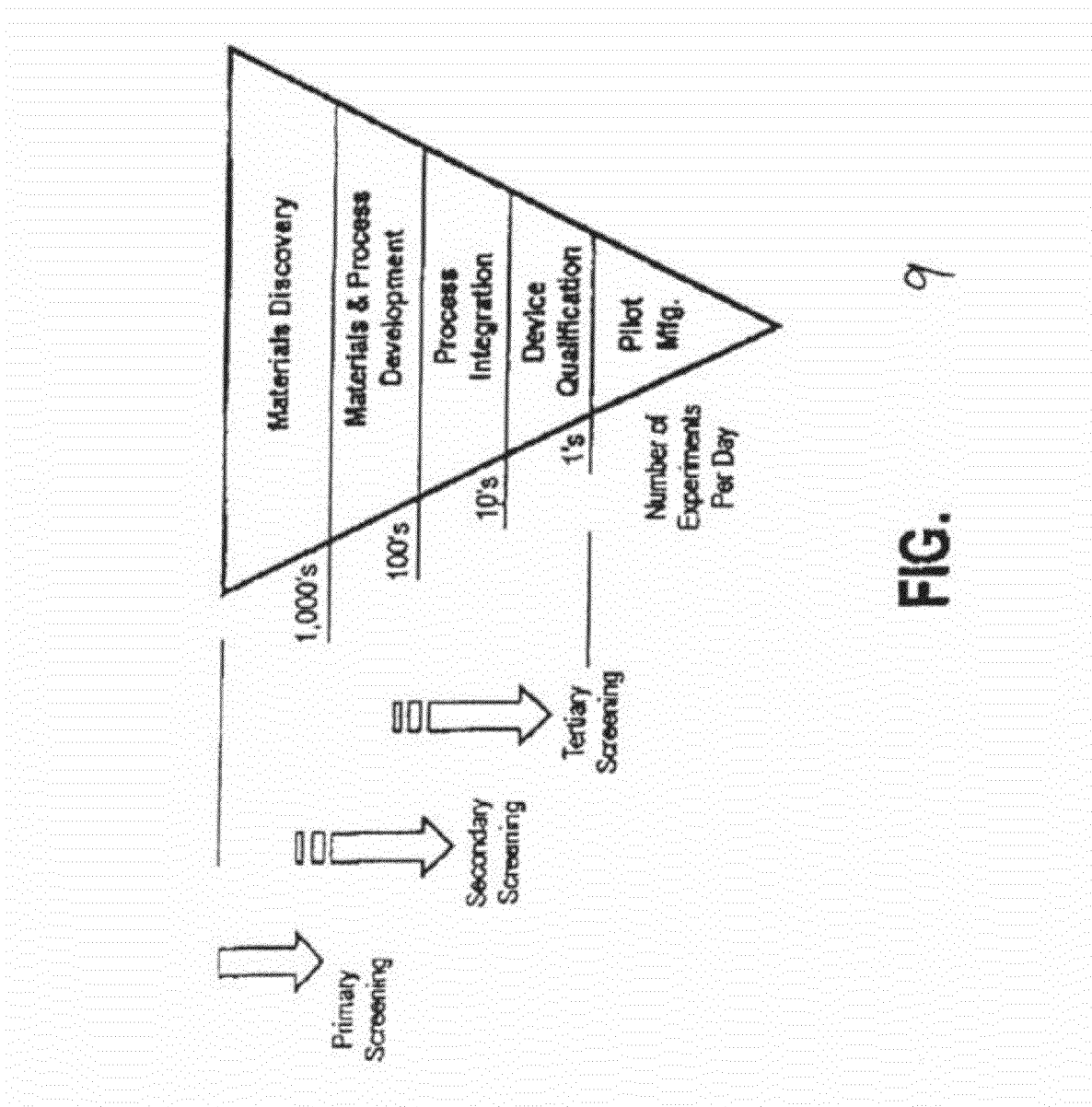
FIG. 9 is a simplified schematic diagram illustrating an overview of the High-Productivity Combinatorial (HPC) screening process for use in evaluating materials, unit processes, and process sequences for the manufacturing of semiconductor devices in accordance with one embodiment of the present invention.

FIG. 9 is a simplified schematic diagram illustrating an overview of the High-Productivity Combinatorial (HPC) screening process for use in evaluating materials, unit processes, and process sequences for the manufacturing of semiconductor devices incorporating chalcogenide materials in accordance with on embodiment of the invention. The materials utilized for the chalcogenide atomic layer deposition process include materials that are highly reactive and need to be segregated prior to the entrance into the deposition chamber. Thus, the showerhead described herein may be employed with this process as provided below for porting at least two separate components that distribute the at least two individually separate fluid sources over a quadrant, or other portion, of substrate, in support of the HPC method of partitioned deposition. As illustrated in FIG. 9, primary screening incorporates and focuses on chalcogenide materials discovery in one embodiment. Here, the materials may be screened for certain properties in order to select a subset of possible candidates for a secondary level of screening, which will look at materials and unit processes development and process integration. Thereafter, tertiary screening further narrows these candidates through process integration and device qualification in order to identify possible optimizations in terms of materials, unit processes and process sequence integration.

The time required to perform this type of screening will vary, however, the efficiencies gained through the HPC methods provide a much faster development system than any conventional technique or scheme. While these stages are defined as primary second and tertiary, these are arbitrary labels placed on these steps. Furthermore, primary screening is not necessarily limited to materials research and can be focused on unit processes or process sequences, but generally involves a simpler substrate, less steps and quicker testing than the later screening levels.

The stages also may overlap and there may be feedback from the secondary to the primary, and the tertiary to the secondary and/or the primary to further optimize the selection of materials, unit processes and process sequences. In this manner, the secondary screening begins while primary screening is still being completed, and/or while additional primary screening candidates are generated, and tertiary screening can begin once a reasonable set of options are identified from the secondary screening. Thus, the screening operations can be pipelined in one embodiment. As a general matter and as discussed elsewhere in more detail, the level of sophistication of the structures, process sequences, and testing increases with each level of screening. Furthermore, once the set of materials, unit processes and process sequences are identified through tertiary screening, they must be integrated into the overall manufacturing process and qualified for production, which can be viewed as quaternary screening or production qualification. In one more level of abstraction, a wafer can be pulled from the production process, combinatorially processed, and returned to the production process under tertiary and/or quaternary screening.

Figure 10:
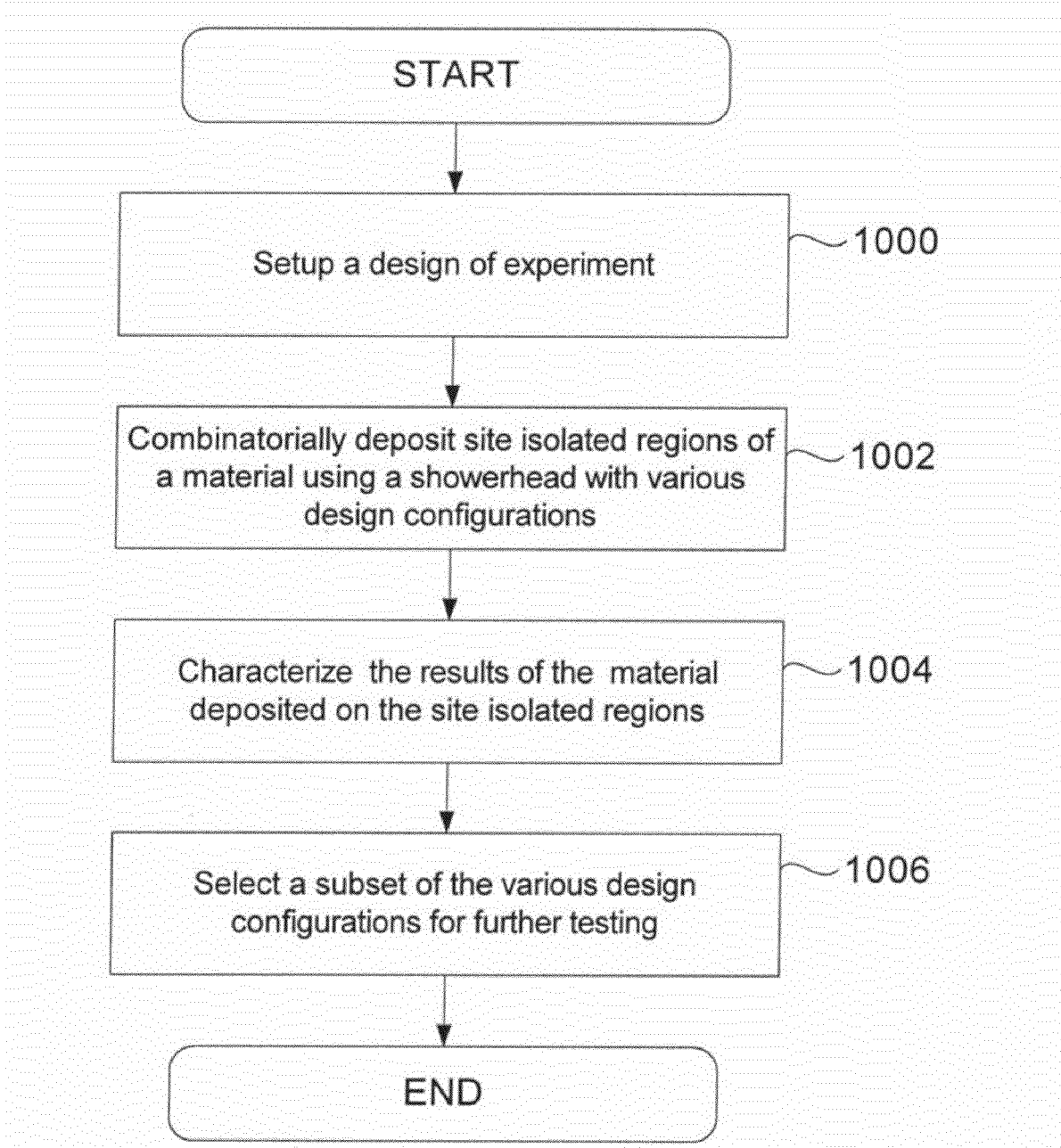
FIG. 10 is an exemplary flow chart diagram illustrating a work flow for the screening of a chalcogenide material in accordance with one embodiment of the invention.
Figure 11:
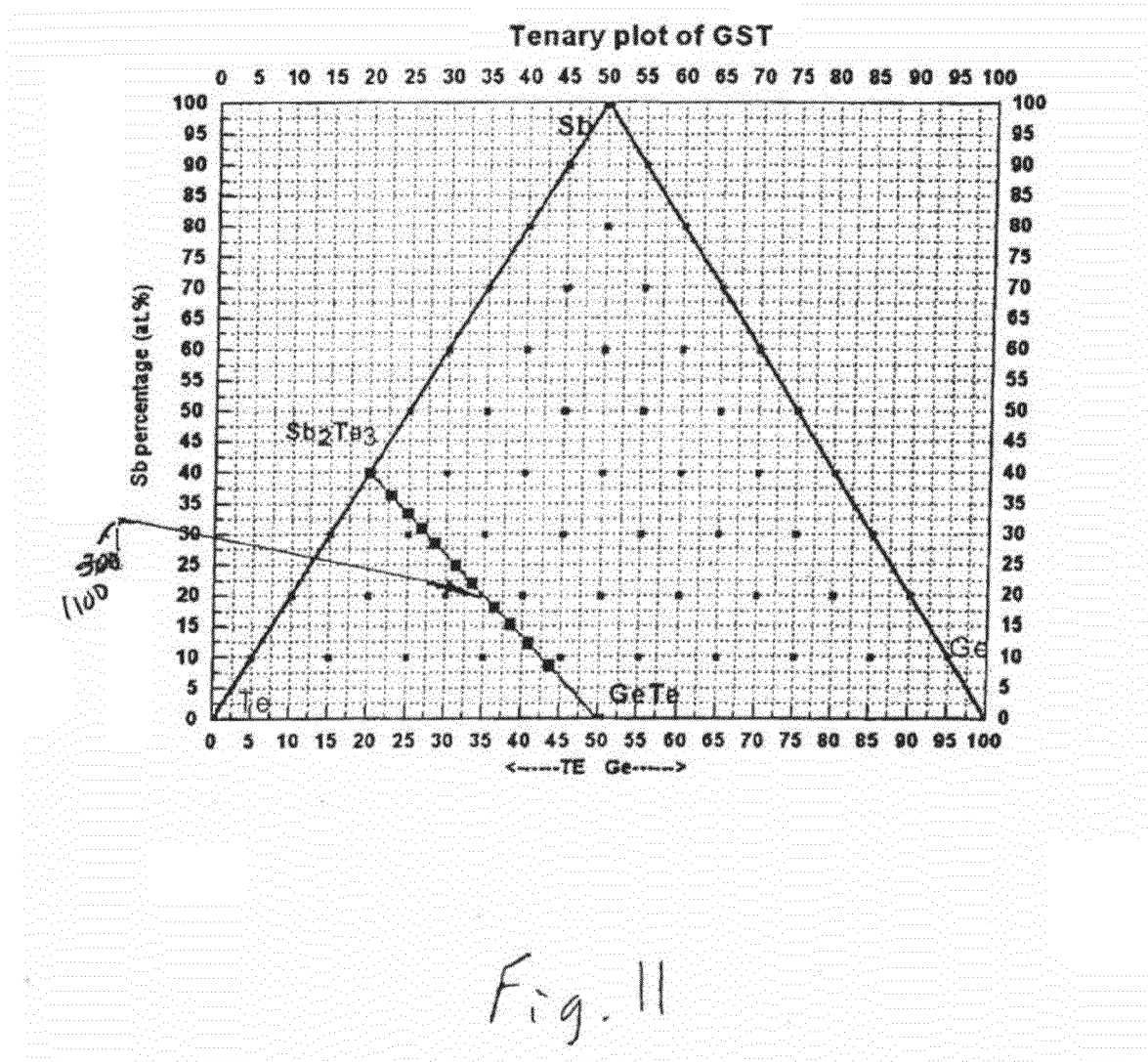
FIG. 11 illustrates an exemplary ternary plot that may be utilized for the design of experiment, in accordance with one embodiment of the present invention.

FIG. 10 is an exemplary flow chart diagram illustrating a work flow for the screening of process development in accordance with one embodiment of the invention. In operation 1000, a design of experiment is set up. In one embodiment, a ternary plot of a material property provides information on various compositions for the design of experiment. FIG. 11 illustrates an exemplary ternary plot that may be utilized for the design of experiment, in accordance with one embodiment of the present invention. Tie line 1100 represents a line that crosses the ternary plot of FIG. 11 between two binary states of material properties. In one embodiment, different compositions along tie line 1100 may be utilized to develop the compositions for site isolated regions on a substrate. One skilled in the art will appreciate that while a single tie line is illustrated here, this is not meant to be limiting. That is, multiple tie lines may be used in order to derive compositions to be combinatorially deposited in a site isolated manner on a substrate for testing. The compositions deposited on a substrate may come from a single tie line or multiple tie lines. Alternatively, the compositions may be randomly generated from a ternary plot. The compositions for the material listed in the ternary plot of FIG. 11 may be highly reactive and need to be isolated from each other prior to introduction into the deposition chamber. In one embodiment, a reactive combination is silane and oxygen. In another embodiment, trimethylaluminum (TMA) and oxygen/ozone are another reactive combination that can benefit from separation. Generally speaking, most reactants that are oxidized can benefit from separation from the oxidizer to prevent pre-reaction and any resultant particle generation.

In other embodiments, the design of experiment can include various designs of showerhead portions. For example, various showerhead portions can have different thru-hole sizes, or channel widths. Alternatively, the showerhead portions can also vary the distances between radial channels and radial groups. In still other design of experiments, the thru-hole sizes and channel widths can vary within one showerhead portion along with the distances between radial channels and radial groups. In still other embodiments, various different fluid combinations are passed through a variety of showerhead portions of different designs.

Returning to FIG. 10, in operation 1002, site isolated depositions of different compositions are provided onto a surface of a substrate with a showerhead composed of sections with various design configurations. It should be appreciated that the High Productivity Combinatorial (HPC) deposition tools owned by the assignee may be utilized to deposit the material onto a substrate in a site isolated fashion. The composition for each site isolated region may be selected based on a ternary plot for a design of experiment in one embodiment. Depositing the material in a combinatorial manner may include varying one or more of unit processes, process sequences, and materials. For example, in addition to, or alternatively to, varying the composition of the material properties deposited between the regions, the thickness of the layer of material may vary. Numerous other parameters may be varied under the combinatorial processing and the exemplary parameters discussed are not meant to be limiting. One skilled in the art will appreciate that within each region, the composition is deposited in a substantially uniform manner. In one embodiment, the depositing is performed through a showerhead having isolated distribution networks for a plurality of fluids as described herein. In this embodiment, the plurality of fluids flow through the isolated distribution networks and one of the fluids is dispensed from a top surface of the showerhead prior to exiting from a bottom surface of the showerhead.

In operation 1004, the results of the material deposited on the site isolated regions are characterized. Based on the design of experiment, the characterizations can include, but are not limited to electrical resistance, thickness of the deposition, and uniformity of the thickness of the deposition across the entire site isolated region. Operation 1006 selects a subset of the various design configurations for further testing based on the analysis of the characterizations in light of the design of experiment.

It should be appreciated that the embodiments described herein provide for a showerhead that isolates a plurality of fluids from each other while flowing into a deposition chamber. In the embodiments described above, reactive gases utilized for the deposition of films on a substrate proceed through the showerhead through separate pathways. A mating gasket provides the means for isolating the plurality of flows in one embodiment. Thus, the embodiments support a combinatorial process providing partitioned deposition in one embodiment. In another embodiment, the lack of large volumes within the distribution pathway permits quick purging, helping to make fast transitions from reactant rich gas stream to an inert gas stream. One skilled in the art will appreciate that the patterns of holes on the showerhead may be interlaced as described above or distributed differently to evaluate different distribution patterns on a combinatorially processed substrate. In addition, the exemplary thicknesses, diameters, and materials of construction listed herein are not meant to be limiting. That is, the dimensions are provided for illustrative and exemplary purposes and may vary based on the application for which the showerhead is being utilized.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for testing multiple showerhead designs in a single showerhead, comprising: providing a showerhead having a plurality of portions, each of the portions comprising a plate, wherein each plate has a distribution face and a dispensing face, wherein the distribution face comprises a plurality of channels formed therein; each of the channels having a plurality of channel thru-ports extending from the channel to the dispensing face of the plate; wherein each plate further comprises a gasket pressed onto the distribution face, wherein the gasket comprises a plurality of cut-outs through the gasket forming a gasket network; wherein each plate further comprises an internal network, the internal network comprising passages formed below the plurality of channels and above the dispensing face, a set of internal network ports extending from the passages to the distribution face and a set of internal network thru-ports extending from a top surface of the distribution face to the dispensing face; wherein the set of internal network ports and the set of internal network thru-ports align with the gasket network; and varying a feature of the design of the showerhead between the plurality of portions.

2. The method of claim 1 wherein the varying a feature of the design comprises varying the channel thru-port sizes.

3. The method of claim 1 wherein the varying a feature of the design comprises varying the internal network thru-port sizes.

4. The method of claim 1 wherein the varying a feature of the design comprises varying the sizes of the plurality of showerhead portions.

5. The method of claim 1 wherein the varying a feature of the design comprises varying the distribution of the internal network thru-ports.

6. The method of claim 1 wherein the varying a feature of the design comprises varying the widths of the plurality of channels.

* * * * *